(12) United States Patent
Langereis et al.

(10) Patent No.: US 8,871,076 B2
(45) Date of Patent: Oct. 28, 2014

(54) METHOD AND DEVICE FOR PRODUCING SOLAR CELLS

(75) Inventors: Ronald Langereis, Veldhoven (NL); Gregorius Johannes Bertens, Tilburg (NL)

(73) Assignee: Meco Equipment Engineers B.V., Dr Drunen (NL)

( * ) Notice: Subject to any disclaimer, the term of this patent is extended or adjusted under 35 U.S.C. 154(b) by 612 days.

(21) Appl. No.: 12/936,526

(22) PCT Filed: Apr. 7, 2009

(86) PCT No.: PCT/NL2009/000083
§ 371 (c)(1),
(2), (4) Date: Nov. 18, 2010

(87) PCT Pub. No.: WO2009/126021
PCT Pub. Date: Oct. 15, 2009

(65) Prior Publication Data
US 2011/0259751 A1    Oct. 27, 2011

(30) Foreign Application Priority Data
Apr. 7, 2008 (NL) .................................. 1035265

(51) Int. Cl.
*C25D 5/02* (2006.01)
*C25D 11/32* (2006.01)
*H01L 21/677* (2006.01)
*C25D 17/00* (2006.01)
*H01L 31/18* (2006.01)
*C25D 17/06* (2006.01)
*C25D 17/28* (2006.01)

(52) U.S. Cl.
CPC .......... *C25D 17/001* (2013.01); *H01L 21/6776* (2013.01); *H01L 31/18* (2013.01); *C25D 17/06* (2013.01); *H01L 21/67712* (2013.01); *C25D 17/28* (2013.01); *C25D 17/005* (2013.01)
USPC ........... 205/128; 205/118; 205/122; 205/123; 205/134; 205/157

(58) Field of Classification Search
USPC .......... 205/118, 122, 128, 137, 157, 123, 134
See application file for complete search history.

(56) References Cited

U.S. PATENT DOCUMENTS 4,162,955 A * 7/1979 Schregenberger ............ 204/624
4,401,522 A * 8/1983 Buschow et al. ............. 205/145

(Continued)

FOREIGN PATENT DOCUMENTS

DE    10 2006 033 353    1/2008
FR         2 800 049     4/2001

(Continued)

OTHER PUBLICATIONS

Gangopadhyay et al., "Front Grid Design for Plated Contact Solar Cells", IEEE (© no month, 2002), pp. 399-402.*

*Primary Examiner* — Edna Wong
(74) *Attorney, Agent, or Firm* — Barnes & Thornburg LLP (57) ABSTRACT

Solar cells are produced using a method for producing solar cells, wherein silicon containing vitreous substrates is provided, wherein each substrate is provided with an electrically conductive material on at least one side thereof. In the method, at least a portion of each substrate is successively transported through an electrolytic solution that is present in an electrolytic bath, and the electrically conductive material as the cathode is connected during the transport of the substrates through the electrolytic bath for the purpose of electrodepositing material from the electrolytic solution onto the electrically conductive material during said transport, wherein the substrates are suspended from a conveyor element during transport and extend in the transport direction.

5 Claims, 5 Drawing Sheets

(56) References Cited

U.S. PATENT DOCUMENTS

| | | | | |
|---|---|---|---|---|
| 4,534,843 | A | * | 8/1985 | Johnson et al. ............... 204/202 |
| 4,539,090 | A | * | 9/1985 | Francis .......................... 204/198 |
| 4,775,046 | A | | 10/1988 | Gramarossa et al. ...... 198/803.8 |
| 5,702,583 | A | * | 12/1997 | Rischke et al. ................. 205/82 |
| 2002/0189665 | A1 | * | 12/2002 | Bhattacharya ................ 136/262 |
| 2009/0101511 | A1 | * | 4/2009 | Lochtman et al. ............ 205/137 |

FOREIGN PATENT DOCUMENTS

| | | | | |
|---|---|---|---|---|
| JP | 62136599 A | * | 6/1987 | ............. C25D 17/00 |
| JP | 10-0749924 | | 8/2007 | |
| WO | 03/016182 | | 2/2003 | |
| WO | WO 2007118875 A2 | * | 10/2007 | ............... C25D 5/54 |

* cited by examiner

METHOD AND DEVICE FOR PRODUCING SOLAR CELLS

CROSS-REFERENCE TO RELATED APPLICATIONS

The present application claims the benefit of priority to International Patent Application No. PCT/NL2009/000083 filed 7 Apr. 2009, which further claims the benefit of priority to Dutch Patent Application No. 1035265 filed 7 Apr. 2008, the contents of which are incorporated herein by reference in their entirety.

The present invention relates to a method for producing solar cells, comprising the steps of providing silicon containing vitreous substrates, each provided with an electrically conductive material on at least one side thereof, successively transporting at least a portion of each substrate through an electrolytic solution that is present in an electrolytic bath, connecting said electrically conductive material to act as the cathode during the transport of the substrates through the electrolytic bath for the purpose of electrodepositing material from the electrolytic solution onto the electrically conductive material during said transport.

The invention relates exclusively to a method for producing solar cells. At the moment at least, the manufacture of such solar cells mainly takes place on the basis of rectangular silicon panels. Such substrates typically have a thickness of only 50 to 300 µm and, also on account of the nature of the material, are very fragile and difficult to handle manually. A conductive track is frequently present on the silicon panel, on the side thereof where the light is incident, via which track electrons released in the silicon panel by incident light can be discharged, and which track forms part of an electrical circuit together with the connected load. For reasons of efficiency it is best if such tracks cover as little surface area of the silicon panel as possible. On the other hand, the cross-sectional area of the tracks must be adapted to deal with the electric current that is to pass through said tracks.

In the manufacture of solar cells it is known to use silicon panels as the substrates, to which a so-called seed layer of the electrically conductive material, such as Ag, is applied in the shape of the desired final track. Said seed layer is subsequently made thicker or higher through the addition of an electrically conductive material by means of an electrolytic or electroless plating process. An example of such a method, in which an electroplating process is used, is described in German patent application DE 10 2006 033 353 A1. The method described in the introduction relates to the method as described in said publication.

Said publication more specifically describes how substrates are passed through an electrolytic bath in a horizontal orientation, one behind the other. To that end, use is made of conveyor rollers arranged one behind the other, on which the substrates are supported, and of contact rollers disposed directly above said conveyor rollers, via which cathodic contact can be made with the tracks on the upper side of the substrate. The substrates move with the light incidence side facing downwards, just below the liquid level of an electrolytic solution in the electrolytic bath, so that the contact rollers extend only partially below the liquid level. Each contact roller is connected via an electrical switch to an electronic circuit which also comprises a rectifier and the anode. A control system ensures that the switch is only in the closed position (conductive state) during those moments in which the associated contact roller is in contact with a track. In addition to that, a blow nozzle is provided, which blows electrolytic solution away from the region of a contact roller so as to prevent the contact roller itself from being contaminated through electroplating.

The known method has a number of drawbacks. In the first place it is pointed out in this connection that the required electroplating apparatus requires a comparatively large floor area. In addition to that, the inevitable screening caused by the conveyor rollers will have an adverse effect on the quality of the electroplating process on that portion of the substrate where the substrate is conveyed over the conveyor rollers. Moreover, the process is comparatively difficult to control because of the required synchronisation of the switches and the blow nozzle on the one hand and the movement of the substrate through the electrolytic bath on the other hand. For reasons pertaining to the process, it is furthermore disadvantageous if the deposition rate is limited by the conductive capacity of the (semiconductor) substrate material. In practice this necessitates a comparatively long dwell time of the substrates in the electrolytic bath.

It is an object of the present invention to eliminate or at least alleviate the aforesaid drawbacks, which may or may not be realised by means of preferred embodiments of the invention. In order to achieve this object, the method according to the invention is in the first place characterised in that the substrates are suspended from a conveyor element during transport and extend in the transport direction. Since the substrates are transported in a suspended condition, the substrates are vertically oriented, and since the substrates extend in the transport direction, the electrolytic bath can be relatively narrow, thereby reducing the required floor area. In addition, since the substrates are conveyed in this suspended condition, a major portion of the surface area of the substrates remains clear and can thus be optimally electroplated. The invention is based on the surprising recognition that, in spite of the vulnerable nature of the vitreous substrates, which as a rule will have a maximum thickness of 500 .mu.m, said substrates can nevertheless be conveyed in the suspended condition through an electrolytic solution in an electrolytic bath.

Quite preferably, the substrates are freely suspended from the conveyor element during transport, so that no additional facilities, which may or may not move along with the substrates, are required for supporting the substrates in the bath.

When the present invention is used in the manufacture of solar cells, it is preferable if the electrically conductive material is applied to at least one side of the substrates in the form of at least one track. A limited number of main tracks can usually be distinguished in practice, and perpendicular thereto a larger number of parallel auxiliary tracks which intersect the main tracks. A solar cell often has two main tracks, while the auxiliary tracks are provided with an interspacing of between 3 and 5 mm. Because of the required current carrying capacity, the main tracks are significantly wider than the auxiliary tracks.

Advantageously, the substrate is clamped in at an upper edge thereof during transport by at least one clamping element that forms part of the conveyor element.

According to a further preferred embodiment the at least one track extends vertically and said at least one clamping element engages the substrate at an upper end of said at least one track for connecting this track as the cathode. The at least one vertically extending tracks preferably are busbars for the solar cell to be produced. Thus, said at least one clamping element is used not only for suspending the substrates therefrom but also for connecting the track as the cathode.

Preferably, furthermore, each substrate is clamped in at its upper edge during transport by means of not more and not fewer than two clamping elements that form part of the conveyor element. The use of exactly two clamping elements for each substrate offers the possibility of suspending the substrate in a stable manner, while it was also surprisingly found that the substrates, when fitted with exactly two clamping elements each, can move during their transport along an at least partly curved transport path in accordance with a further preferred embodiment. Such a curved transport path may be realised, for example, in that the conveyor element is guided around a transport wheel having a diameter of, for example, between 1.0 and 2.0 m, preferably approximately 1.5 m.

In a very advantageous embodiment, the substrates have their regions that are clamped in by the at least one clamping element located above the electrolytic solution. It is true that this implies that the portion of each substrate located above the electrolytic solution will not be electroplated, but at the same time this also holds for the clamping elements themselves, which can also be located above the electrolytic solution by virtue of this preferred embodiment. The at least one clamping element thus requires no or at least hardly any cleaning after a substrate has been guided through the electrolytic solution in the electrolytic bath by means of the at least one clamping element.

The present invention further relates to a device for producing solar cells, comprising an electrolytic bath for an electrolytic solution, transport means for transporting successive silicon containing substrates in a transport direction through the electrolytic solution, each substrate having an electrically conductive material provided on at least one side thereof, and contact means for connecting the tracks as cathodes during at least part of the transport. Such a device is known from the publication DE 10 2006 033 353 A1 cited above. The device according to the invention is characterised first of all in that the transport means comprise a conveyor element that is fitted with clamping elements designed to clamp in, by means of clamping ends thereof, an upper edge of a substrate so as to suspend said substrate, which clamping elements are at least in part also integral with the contact means, so that high electroplating currents are made possible and a high deposition rate of electroplating material can be achieved.

Quite preferably, the clamping elements are designed for freely suspending the substrate.

It is preferred that the conveyor element comprises a flexible tape of electrically conductive material that extends along a continuous horizontal track in order first to achieve a simple construction of the conveyor element and second to be able to use the conveyor element also for the necessary cathode connection of the electrically conductive material provided on the substrates.

For driving the conveyor element, advantageously, indentations are provided at regular intervals in the flexible tape, and the transport means further comprise at least one drive gear whose teeth engage said indentations.

If said indentations are rectangular and the teeth have an at least substantially triangular shape in horizontal cross-sections, an extremely stable and rectilinear transport of the substrates through the electrolytic solution can be obtained without even limited undulating movements of the substrates in vertical direction.

It is preferred inter alia for constructional reasons that each conveyor element comprises two parts, the lowermost ends of the respective two parts constituting the clamping ends.

To reduce the number of parts to be assembled it is advantageous if one of the two parts is integral with the flexible tape which one part preferably is a lip extending downwardly from a lower edge of the flexible tape.

Quite preferably, the clamping ends extend below a lower edge of the flexible tape, so that there is definitely no need for the flexible tape itself to pass through the electrolytic solution, which would necessitate a regular cleaning or etching of the flexible tape, irrespective of whether the clamping ends are located above or inside the electrolytic solution during electroplating of the substrates.

The above advantage does not only apply when producing solar cells but does also apply when substrates are electroplated in general. For this reason the present invention also relates to a device for electroplating substrates, comprising an electrolytic bath for an electrolytic solution, transport means for transporting successive substrates in a transport direction through the electrolytic solution, the transport means comprising a conveyor element that is fitted with a flexible tape of an electrically conductive material that extends along a continuous horizontal track and with clamping elements designed to clamp in, by means of clamping ends thereof, an upper edge of a substrate so as to suspend said substrate at least partly in said bath, in which the clamping ends extend below a lower edge of the flexible tape.

The use of two parts for each clamping element has the advantage for the process that it offers a possibility of connecting electrically conductive material on one or on both sides of the substrate to the cathode, as desired. It is advantageous in this connection if one of the two parts is made from an electrically conductive material and the other one of the two parts is at least partly made from an electrically insulating material. The part which at least partly is made from an electrically insulating material could for instance be made from a ceramic, a synthetic resin but could also be coated with an insulating layer.

It is constructionally advantageous, furthermore, if the two parts bear on one another under the influence of their own spring force. The clamping elements can thus be quickly assembled together with the conveyor element, but can also be quickly disassembled again, for example for replacing a clamping element.

To reduce mechanical loads on the substrates as much as possible, both while the loads enter the electrolytic bath and while they leave the electrolytic bath, a sloping slot, preferably a slot sloping in a direction opposed to the transport direction, is provided in at least one wall, more preferably in two mutually opposed walls, of the electrolytic bath. Such a sloping slot renders it possible for each substrate to be gradually entered into the electrolytic bath such that the upper side of each substrate is the first to enter the bath and/or is the first to leave the bath again.

A further possibility for reducing the mechanical loads on the substrates during traversing the electrolytic bath is offered in that panels with holes therein are provided at mutually opposed sides of the path followed by the substrates through the electrolytic bath. The panels as it were screen off the substrates against a too rough flow of the electrolytic solution, which is continuously circulated by a pump, as is known to those skilled in the art.

It is advantageous, furthermore, if an anode is provided between at least one of the panels and a wall of the electrolytic bath that extends parallel to said at least one panel, such that this anode itself definitely does not interfere with the flow of the electrolytic solution between said panels and the substrates.

The flow of the electrolytic solution in the immediate vicinity of the substrates can be further reduced in that at least one upright wall of the electrolytic bath is provided with an overflow edge for the electrolytic solution at the outer side of the panels.

BRIEF DESCRIPTION OF THE FIGURES

The invention will be explained in more detail below with reference to a description of a preferred embodiment and to the accompanying figures, in which.

DETAILED DESCRIPTION

Figure 1:
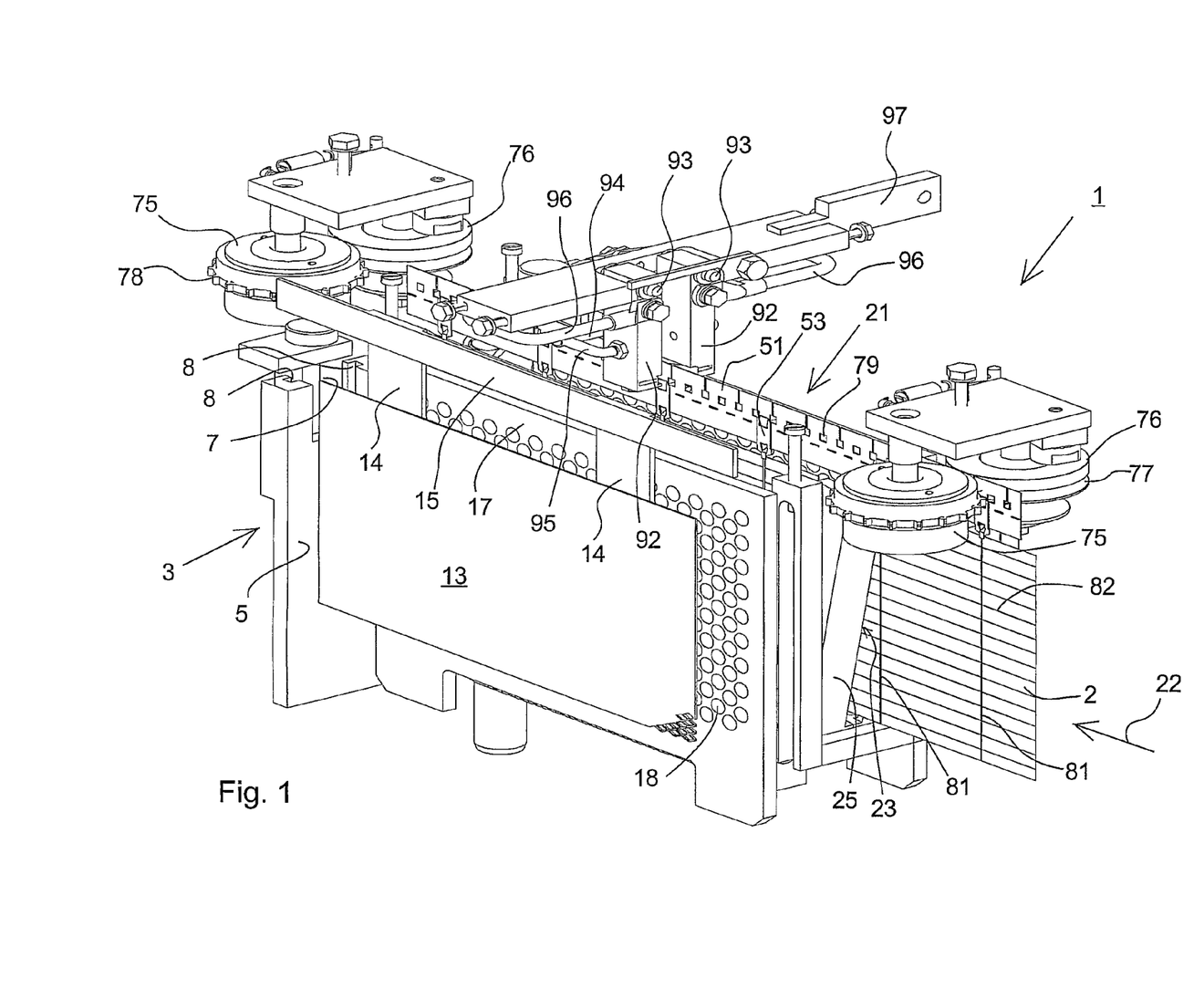
FIG. 1 is an isometric view of part of a preferred embodiment of a device according to the invention, wherewith at the same time the method according to the invention can be clarified.
Figure 2:
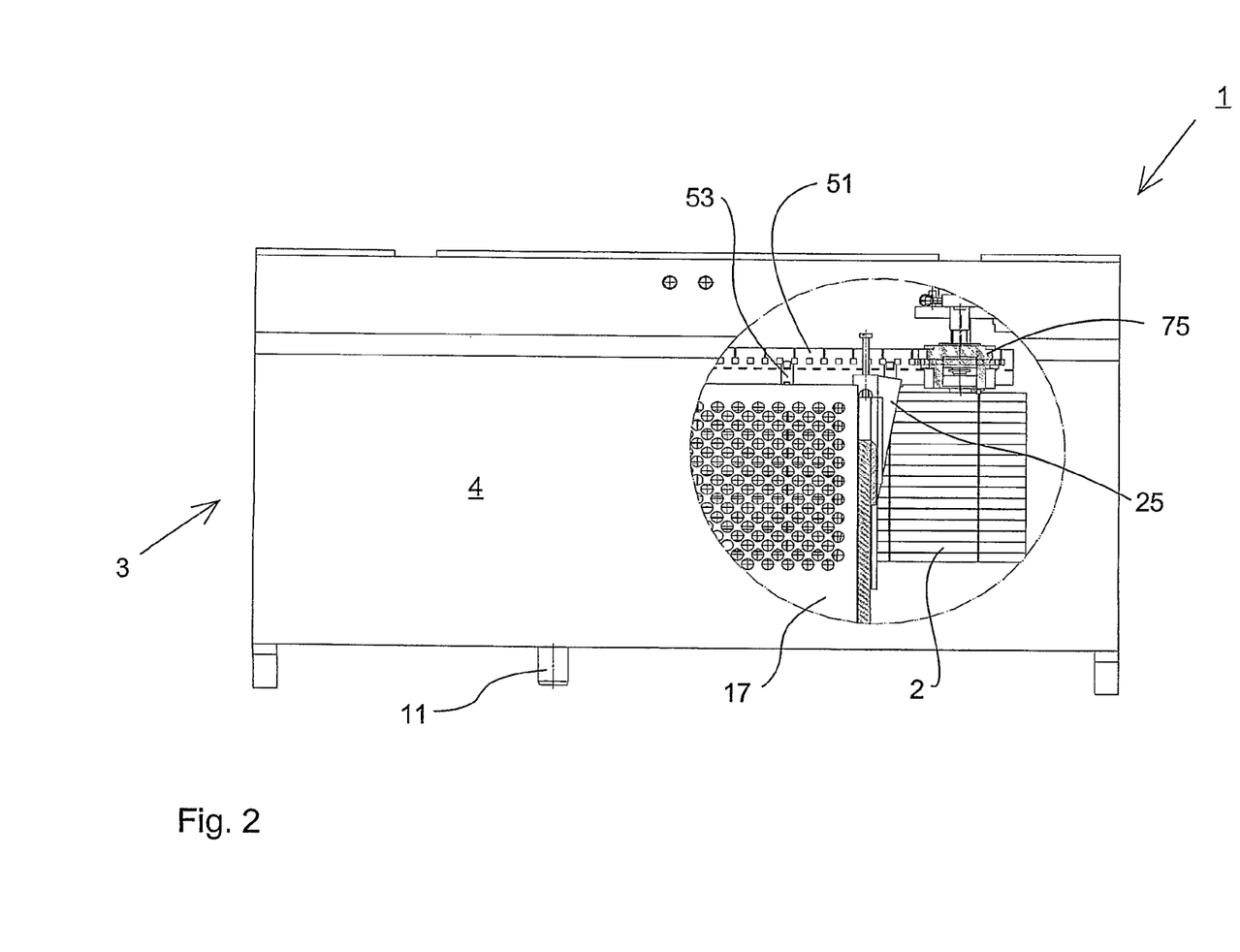
FIG. 2 shows the device of FIG. 1 in side elevation.
Figure 3:
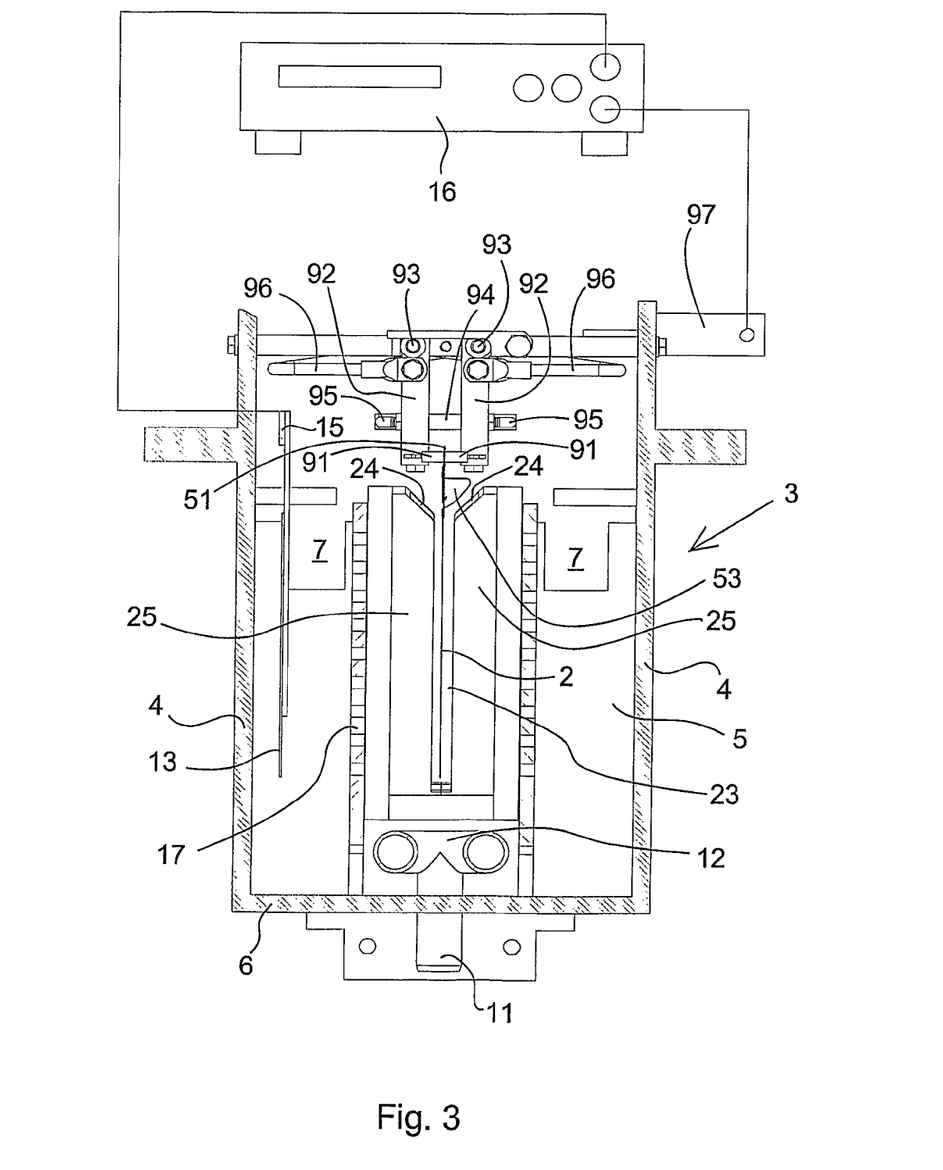
FIG. 3 shows the device of FIG. 1 in a vertical sectional view.
Figure 4:
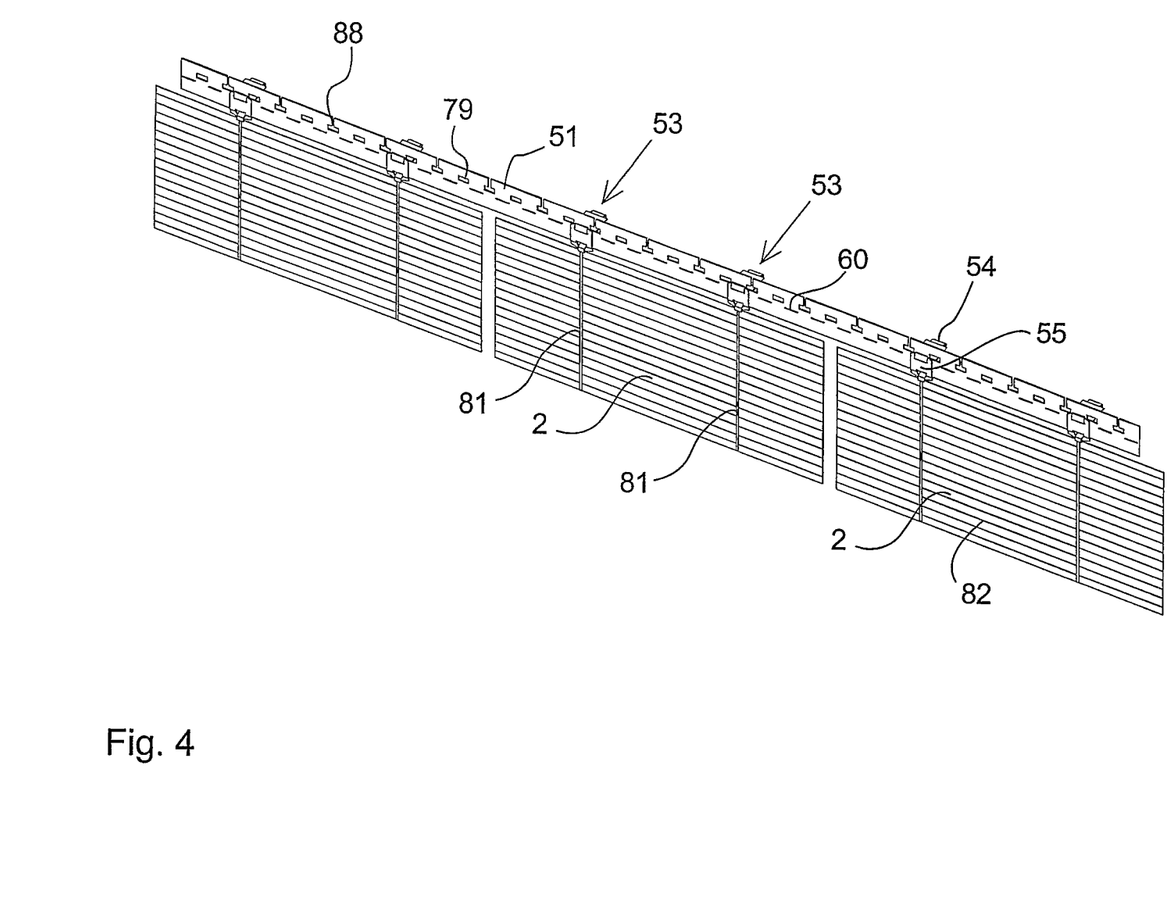
FIG. 4 is an isometric view of part of a conveyor element as used in the device of FIG. 1, with substrates suspended therefrom.

The FIGS. 1, 2, and 3 show (portions of) a preferred embodiment of a device according to the invention in various elevations and sectional views. The device 1 is designed for the electroplating of rectangular, panel-shaped substrates 2. Specifically in the present invention, these substrates are composed of a non-metallic, vitreous material such as especially square silicon panels whose sides have a length of between approximately 125 mm and 210 mm and whose thickness lies between 50 μm and 300 μm. It is characteristic of this type of material that it is very vulnerable and is easily fractured. Such substrates are used in the manufacture of solar cells. In the present example, an electrically conductive material, here in the form of two (vertically oriented) straight main tracks 81 or busbars 81 and a larger number of (horizontally oriented) straight auxiliary tracks 82, has been provided on one side of each substrate 2 (on the side facing the viewer in FIGS. 1 and 2), for example by means of vapour deposition or printing, such that said auxiliary tracks 82 each intersect the main tracks 81 and accordingly are in electrical contact therewith. Prior to electroplating, the thickness of the main tracks 81 and the auxiliary tracks 82 is at most 5 μm, and preferably 2 to 3 μm, while the width of the auxiliary tracks 82 lies between 50 and 150 μm and preferably is approximately 80 μm.

The device 1 comprises an electrolytic bath 3 for an electrolytic solution with mutually opposed side walls 4, mutually opposed end walls 5, and a bottom 6. The side wall 4 facing the viewer and the end wall 5 facing the viewer have not been shown in FIG. 1 for the sake of clarity, so that the interior of the bath 3 is visible. Each end wall 5 is provided with two recesses 7, each having two mutually facing U-shaped guide slots 8 by means of which a slide (not shown) can be accommodated in the recesses 7. The upper edge of such a slide serves as an overflow and defines the liquid level of the electrolytic liquid in the bath 3. A vertical feed tube 11 is provided for the supply of the electrolytic liquid, which is continuously circulated by pumping means (not shown) during operation, which feed tube 11 extends through the bottom 6 and issues inside the bath 3 adjacent the bottom 6 into a horizontal tube 12 which issues at two mutually opposed sides relative to the centre of the bath 3, as is visible in FIG. 3.

Inside the bath 3, furthermore, there is an anode 13 (not shown in FIG. 2 for the sake of clarity) which extends parallel to one of the, side walls 4. The anode 13 is planar and in fact has a grid shape, as is depicted in the right-hand bottom corner of FIG. 1. The anode 13 is suspended from two strips 14 which are (anodically) connected to a rectifier 16 (not shown) via inter alia a contact strip 15.

Furthermore, two mutually opposed distributor plates 17, which are yet to be described in more detail and which are provided with a regular, relatively dense pattern of holes 18, are present inside the bath 3. The space between the distributor plates 17 is to accommodate substrates 2, i.e. the latter are to be transported through the electrolytic liquid in the bath 3 in this space.

The device 1 further comprises a continuous conveyor element 21, which is yet to be described in more detail and from which substrates 2 can be suspended, for the transport of the substrates 2. The frontmost end wall 5 is provided with a vertical slot 23 for affording the substrates 2 access to the bath, said substrates 2 being transported in the transport direction 22 by the continuous conveyor element 21. Said slot 23 has an oblique orientation with respect to the transport direction 22, such that the upper side of a substrate 2 will pass the slot 23 earlier than the lower side of the same substrate 2. Thus each substrate 2 enters the bath 3 through the slot 23 in a gradual manner, which limits the mechanical loading of the substrate 2. It should be borne in mind here that the electrolytic solution in bath 3 has a tendency to leave the bath 3 through the slot 23.

To limit this outflow of electrolytic liquid through the slot 23 as much as possible, tubes (not shown) extending over the full height of the substrates are provided on either side of the substrate 2 at the area of the slot 23. These tubes are provided inside the mutually facing U-shaped recesses 24 belonging to the sloping profiles 25 which jointly define the slot 23 and which form part of the respective end wall 5. The tubes tend to move towards one another under the influence of the liquid pressure. While a substrate is passing through the slot 23, said tubes will bear on mutually opposed sides of the substrate 2, whereas the vertical slot can be fully closed by the tubes lying against each other when no substrate 2 is present in the slot 23. The tubes can be positioned by a portion 65 of a strip part 55 or by the tape 51 (both to be described further below) such that the entry of substrates 2 can take place unhindered.

For exiting the bath 3, a vertical slot is also provided in the opposite end wall 5, which slot is oriented in parallel and can also be closed off by means of tubes. The slope of the slot at the exit side is such that the upper side of the substrate 2 leaves the bath through the relevant slot first and the lower side of the substrate 2 last. Thus there is a gradual emergence of the substrate 2 from the bath 3, which limits the mechanical loading of the substrate.

While in the bath 3, the substrate 2 is electrolytically treated. During this treatment the electrolytic solution is continuously circulated in the bath 3, as was noted above. More in particular, purified electrolytic liquid enters the bath 3 through the two mutually opposed sides of the horizontal tube 12 at an angle of 45.degree. to the bottom 6 and the walls 4 and flows mainly in the direction of the mutually opposed side walls and from there in upward direction. Particularly at the side of the anode 13, the electrolytic solution may be enriched with metal ions that are dissolved in the electrolytic solution from this anode. A comparatively large portion will subsequently leave the bath again over the upper edges of the slides provided in the recesses 7 at the upper sides of the end walls 5. A limited amount of the electrolytic solution will enter the space between the distributor plates 17 through holes 18 in these distributor plates so as to contribute metal ions to the substrate 2 for the growth of the electrically conductive material present thereon. The use of the distributor plates 17 creates a comparatively quiet flow of electrolytic solution in the immediate vicinity of the substrates 2, which reduces to a minimum mechanical loads on the substrates 2 caused by the flow of the electrolytic solution.

Figure 6:
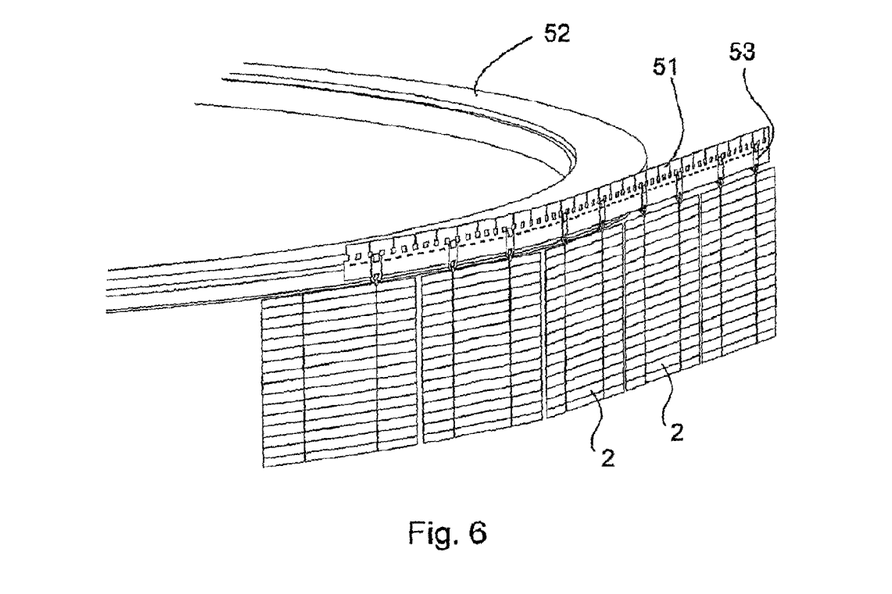
FIG. 6 shows the conveyor element of FIG. 4 in an isometric view at the area of a transport wheel.

As was noted above, a continuous conveyor element 21 is used for transporting the substrates 2 through the bath 3. The continuous conveyor element 21 comprises a continuous tape 51, for example arranged around two transport wheels, FIG. 6 showing a possible embodiment of a transport wheel 52. The conveyor element 21 is guided by pairs of one gear 75 and one pressure roller 76 each, while the drive of the conveyor element 21 is provided by driven transport wheels such as wheel 52 in FIG. 6 around which the conveyor element is tensioned. A pair 75, 76 is provided both upstream and downstream of the bath 3. The gears 75 and pressure rollers 76 are made from a dielectric material. The teeth 78 of the gear 75 are an exception to this, they are made from a metal, such as stainless steel, on account of the favourable wear properties thereof. A groove 77 is provided in each pressure roller 76 at the same height as the teeth 78, into which groove the teeth 78 extend at the side of the gear 75 facing the pressure roller. The tape 51 is provided at regular intervals with rectangular holes 79 which cooperate with the teeth 78 of the gears 75. Thus the conveyor element 21 is guided. It is noted in this connection that the teeth 78 in cross-section are at least substantially triangular, so that the tape 51 remains at the same level during the cooperation mentioned above. To make the tape 51 more flexible in the present preferred embodiment, a vertical slit 88 extending from the hole 79, or at least from every second hole 79, right through to the upper edge of the tape 51 was opted for.

The continuous conveyor element 21 further comprises resilient clamping elements 53 at regular intervals. The pitch of these clamping elements 53 corresponds to the distance between two main tracks 81 on a substrate 2. Furthermore, the substrates 2 are at a distance from one another such that adjoining main tracks 81 are also at the same pitch or distance. This renders it possible to grip each substrate 2 with clamping force by means of two clamping elements 53 adjacent the upper edge of the substrate 2 exactly in the locations of the two main tracks 81 of the relevant substrate 2.

Figure 5:
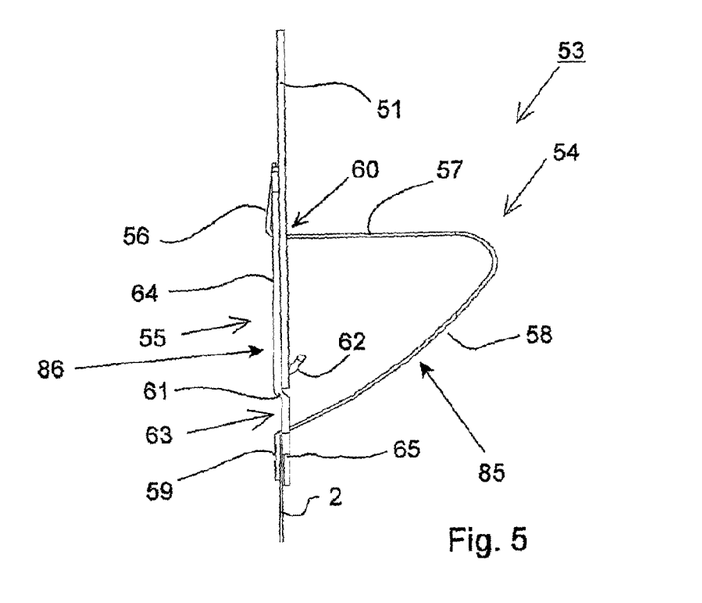
FIG. 5 shows the conveyor element of FIG. 4 in vertical sectional view.

As in particular can be seen in FIG. 5, each clamping element 53 comprises two parts, i.e. a clip part 54 and a strip part 55. The clip part 54 is in fact a bent strip comprising, from top to bottom, an upwardly bent finger 56, a horizontal portion 57, an oblique downward portion 58, and a downwardly bent finger 59. The horizontal portion 57 and the oblique downward portion 58 enclose an angle of approximately 45°. The horizontal portion 57 is passed through a narrow horizontal passage 60 in the continuous tape 51 adjacent the upwardly bent finger 56. Such narrow passages 60 are provided at regular intervals over the full length of the continuous tape 51.

The strip part 55 is a little wider than the strip from which the clip part 54 was manufactured. The strip part 55 extends vertically, except for a slight offset bend 61. The portion 64 of the strip part 55 situated above the offset bend 61 extends parallel to the continuous tape 51, whereas the portion 65 of the strip part 55 situated below the offset bend 61 lies in line with this tape. The strip part 55 is provided with an upwardly bent tag 62 just above the offset bend 61, which tag enters a recess (not visible in the figures) provided in the lower edge of the continuous tape 51 at the area of each clamping element 53. A hole 63, through which the oblique downward portion 58 of the clip part 54 is passed close to the downwardly bent finger 59, is provided in the strip part 55 partly above and partly below the offset bend 61. The substrate 2 is now clamped in between the downwardly bent finger 59 of the clip part 54 and the portion of the strip part 55 located below the hole 63.

The conveyor element 21 is automatically loaded with substrates 2. At a loading station, substrates 2, stacked below and next to the track of the conveyor element 21, are presented to convex vacuum grippers. These vacuum grippers take an uppermost substrate 2 from the stack and pivot it about their horizontal axis parallel to the transport direction 22 until the substrate 2 is in a vertical orientation as shown, for example, in FIG. 1. Two clamping elements 53 are opened at the loading station in that a stud present there presses in the direction of arrow 85 (not shown) against the oblique downward portion 58 of the clip part 54 while at the same time another stud blocks the strip part 55 at the area of arrow 86 and the tape 51 is held by a clamping mechanism. As a result, the downwardly bent finger 59 will move away from the lower portion 65 of the strip part 55 in an oblique upward direction against the resilience of the clip part 54. As soon as this open condition has been achieved, manipulation means will position the vertically oriented substrate 2 against the lower portion 65 of the strip part 55, during which the substrate 2 is moved along with the conveyor element 51 by the manipulation means. The studs mentioned above are subsequently moved away from the clamping element 53, so that the clamping element 53 closes again, whereupon the action of the grippers on the substrate is ended. The cycle described above repeats itself continuously. To increase the capacity, the substrates may alternatively be fed from a number of stacks of substrates, for example two stacks, such that the uppermost substrates of the stacks are simultaneously suspended from the conveyor element. Discharging of the conveyor element takes place in the exactly opposite sequence.

It is important to note that the clamping parts of the clamping elements 53 extend below the tape 51. This brings with it the major advantage that the tape 51 itself need not be immersed, not even in part, in the electrolytic solution while transporting the substrates 2 through the electrolytic solution in the bath 3. This would imply, because of the cathode voltage on the tape 51, that the tape 51 would also be electroplated, which would necessitate a thorough cyclical cleaning of the tape 51 to remove material deposited on the tape 51. If it is desired that each substrate 2 is fully immersed in the electrolytic solution, the clamping parts of the clamping elements 53 will necessarily also be immersed in the electrolytic solution. These parts will then have to be cyclically thoroughly cleaned in as far as these parts are connected to the cathode. On the other hand, it may be highly advantageous alternatively to immerse the substrates 2 almost completely in the electrolytic solution, i.e. up to a level where the clamping elements 53 are still just above the electrolytic solution. This offers the advantage that the clamping elements themselves are not electrochemically treated. A disadvantage of this is that the portion of each substrate 2 located above the electrolytic solution is not treated either. The latter disadvantage, however, may be very limited in practice in view of the fact that the clamping elements 53 grip the substrates 2 very close to their upper edges.

The connection of the main tracks 81, and also of the auxiliary tracks 82 via the main tracks 81, to the cathode is effected through contact shoes 91 which are provided in fixed positions above the electrolytic bath 3 and which make a sliding conductive contact with both sides of the stainless steel continuous tape 51. The contact shoes 91 are provided with pivoting blocks 92 at their lower sides, which blocks are capable of limited pivoting movements about horizontal pivot axes 93 that extend parallel to the transport direction 22. The action of a tension spring 94 on arms 95, each of which bears on the outer side of a respective pivoting block 92, urges said pivoting blocks 92 and thus the contact shoes 91 towards one another. The contact shoes 91 are in electrical contact with the cathode side of the rectifier 16 via inter alia cables 96 and a contact strip 97.

In the present example, the clip part 54 of each clamping element 53 is made from an electrically conductive material, such as stainless steel, so that the electrically conductive contact with an auxiliary track is established via the downwardly bent finger 59. Electrically conductive contact between the clip part 54 and tape 51 is achieved by contact between horizontal portion 57 and tape 51 at the location of passage 60.

If electroplating is to be obtained also at the other side of the substrate 2, the strip part 55 will also have to be made from an electrically conductive material, and the lower end of the strip part 55 will then have to make electrically conductive contact with the electrically conductive material on the relevant side of the substrate 2.

If electroplating is required at one side only, the strip part 55 should preferably be manufactured from an insulating material, such as a synthetic resin or ceramic, or at least should strip part 55 not be in electrical conductive contact with clip part 54 or with tape 51. This would for instance be achieved if at the location of contact between substrate 2 and strip part 55, strip part 55 would be provided with a contacting member which is made from an insulating material such as rubber or if a metallic strip part 55 would be used which would be coated with a insulating layer such as HALAR® ECTFE.

In particular an embodiment as described above having one of the strip part 55 and the clip part 54 being made from an electrically conductive material which one of the strip part 55 and the clip part 54 is also in electrically conducting contact with tape 51 and the other one of the strip part 55 and the clip part 54 being made from an electrically insulating material could very advantageously be used for plating (metallic) leadframes. Such a tape would result in a more homogeneous plating process with no or less Sn plating on tape 51. Furthermore only the clip part 54 which would be plated as far as in electrolytic bath 3 would need regular cleaning. The life time of tape 51 would increase.

In an alternative embodiment strip part 55 or at least the lower part thereof which in FIG. 5 is aligned with tape 51 there below, could be an integral part of the tape 51 and in that case clearly be made from a similar material. These integral parts would form lips which would extend downwardly from the lower edge 89 (not shown) of tape 51.

The invention claimed is:

1. A method for producing solar cells, the method comprising:
providing silicon containing vitreous substrates, each substrate having a thickness between 50 μm and 300 μm and being provided with an electrically conductive material on at least one side thereof;
successively transporting at least a portion of each substrate along a path through an electrolytic solution that is present in an electrolytic bath, wherein each substrate is freely suspended from a conveyor element that conveys each substrate through the electrolytic solution, wherein during the transporting of each substrate, each substrate enters the electrolytic bath and leaves the electrolytic bath via a sloping slot provided in a wall of the electrolytic bath that slopes in a direction opposed to a direction of the transport direction, wherein at least one panel with holes provided therein is provided on a side of the path followed by each of the substrates through the electrolytic bath; and
connecting the electrically conductive material to act as a cathode during the transport of each of the substrates through the electrolytic bath to electrodeposit material from the electrolytic solution onto the electrically conductive material during the transport,
wherein the provided electrically conductive material is applied to at least one side of the substrates in the form of at least one track,
wherein each substrate is clamped in at an upper edge thereof during the transport by at least one clamping element that forms part of the conveyor element, and
wherein the at least one track extends vertically and the at least one clamping element engages each substrate at an upper end of the at least one track for connecting the track as the cathode.

2. The method of claim 1, wherein each substrate is clamped in at its upper edge during the transport by not more and not fewer than two clamping elements that form part of the conveyor element.

3. The method of claim 1, wherein each substrate held by the at least one clamping element moves along an at least partly curved path during the transport.

4. The method of claim 1, wherein regions of each of the substrates clamped in by the at least one clamping element are located above the electrolytic solution.

5. The method of claim 1, wherein the at least one panel with holes includes two panels with holes therein, the two panels being provided at mutually opposed sides of the path followed by each of the substrates through the electrolytic bath.

* * * * *